(12) United States Patent
Yamazaki

(10) Patent No.: US 6,608,876 B2
(45) Date of Patent: *Aug. 19, 2003

(54) PHASE CONTROL CIRCUIT AND PHASE CONTROL METHOD

(75) Inventor: Kiyohiko Yamazaki, Tokyo (JP)

(73) Assignee: Oki Electric Industry Co., Ltd., Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 9 days.

(21) Appl. No.: 09/139,324

(22) Filed: Aug. 25, 1998

(65) Prior Publication Data

US 2002/0051507 A1 May 2, 2002

(30) Foreign Application Priority Data

Feb. 18, 1998 (JP) .............................. 10-036219

(51) Int. Cl.$^7$ .................................................. H03D 3/24
(52) U.S. Cl. ...................................................... 375/376
(58) Field of Search ................................ 375/376, 375, 375/373, 371, 354

(56) References Cited

U.S. PATENT DOCUMENTS

| 4,203,135 A | * | 5/1980 | Sasaki | 348/516 |
| 4,389,622 A | * | 6/1983 | Kackman | 332/101 |
| 5,557,648 A | * | 9/1996 | Ishihara | 375/376 |

* cited by examiner

Primary Examiner—Tesfaldet Bocure
Assistant Examiner—Kevin M. Burd
(74) Attorney, Agent, or Firm—Volentine Francos, PLLC

(57) ABSTRACT

The present invention relates to the control of a phase control circuit and, more particularly, to a DPLL circuit used to accomplish synchronization when connecting a digital network connecting unit such as a digital service unit (DSU) with a radio unit such as a personal handy phone system (PHS); it prevents a problem involved in the phase control during sending or receiving. The phase control circuit has: a phase comparator circuit that compares the phase difference between a synchronizing signal and a signal to be controlled and outputs a phase control signal according to a comparison result; a phase changing circuit that changes the phase of the signal to be controlled according to the phase control signal; and a mask circuit that masks the phase control signal supplied to the phase changing circuit according to a phase control disable signal.

16 Claims, 14 Drawing Sheets

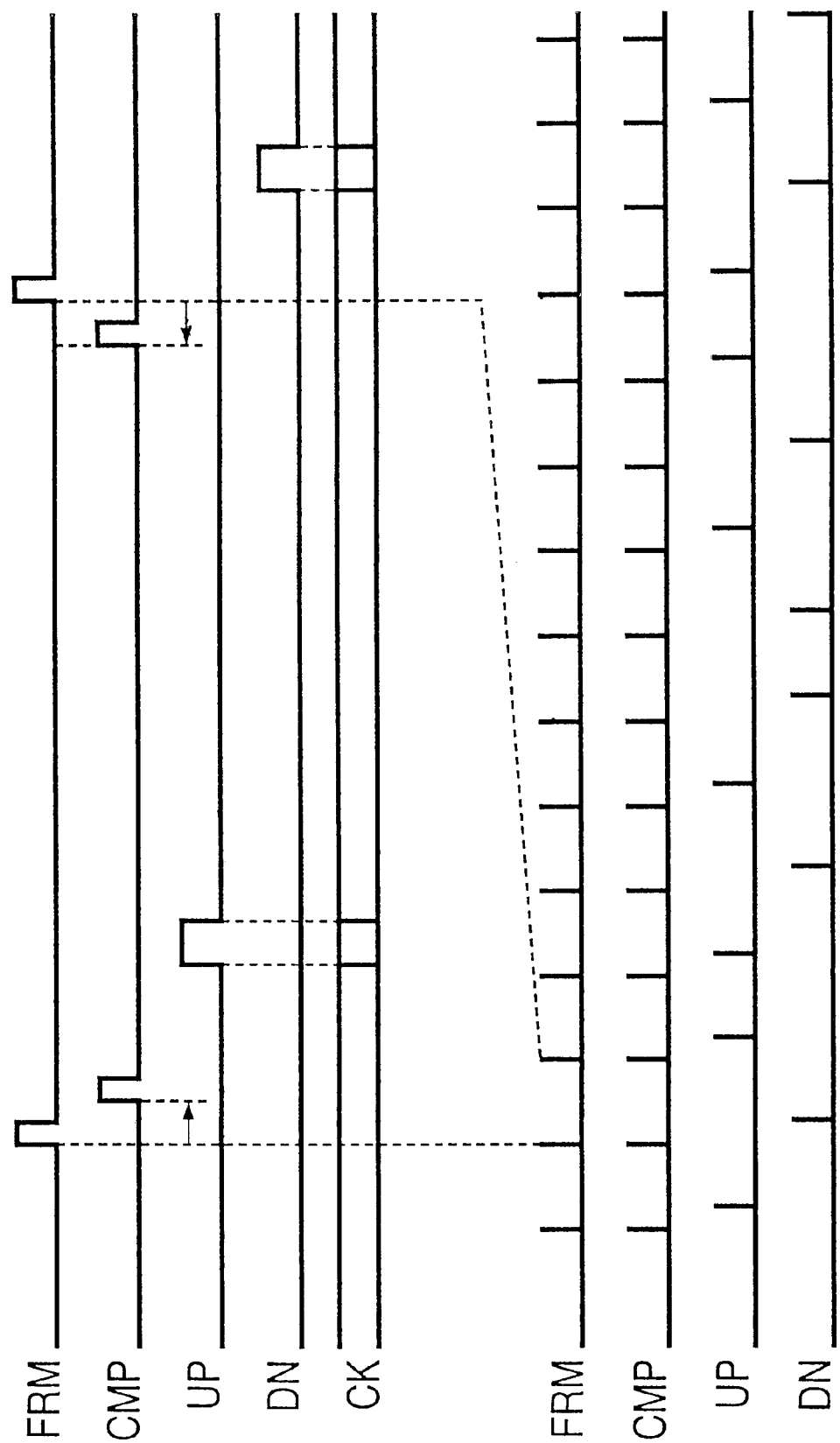

PHASE CONTROL CIRCUIT AND PHASE CONTROL METHOD

BACKGROUND OF THE INVENTION

1. Field of the Invention

The present invention relates to a control method of a digital phased lock loop (DPLL) circuit and, more particularly, to a DPLL circuit used to accomplish synchronization when connecting a digital network connecting unit such as a digital service unit (DSU) with a radio unit such as a personal handy phone system (PHS).

2. Description of Related Art

FIG. 13 is a block diagram of a conventional DPLL circuit connecting a digital network connecting unit with a radio unit.

The digital network is connected to a digital network connecting unit 101; a synchronizing signal FRM output from the digital network connecting unit 101 is applied to a first input terminal of a phase comparator circuit 201 of the DPLL circuit.

A frequency dividing ratio control signal UP issued from the phase comparator circuit is supplied to a first input terminal of a first frequency divider circuit 301. The frequency dividing ratio control signal UP is a signal indicative of a phase delay. A frequency dividing ratio control signal DN issued from the phase comparator circuit is applied to a second input terminal of the first frequency divider circuit 301. The frequency dividing ratio control signal DN is a signal indicative of a phase advance. A master clock signal MCK is applied to a clock input terminal of the first frequency divider circuit 301.

An output signal CK of the first frequency divider circuit 301 is applied to the input terminal of a second frequency divider circuit 302 and the operating clock input terminal of a radio unit 401, while an output CMP of the second frequency divider circuit 302 is applied to a second input terminal of the phase comparator circuit 201.

The operation of the conventional circuit will now be described in conjunction with the timing chart shown in FIG. 14.

The circuit is set so that, if the frequency dividing ratio of the first frequency divider circuit is denoted as N and the frequency dividing ratio of the second frequency divider circuit is denoted as M, then the frequency of MCK/(M× N)=FRM.

First, the phase of the synchronizing signal FRM issued from the digital network connecting unit is compared with the phase of the output CMP of the second frequency divider circuit 302 by the phase comparator circuit 201.

If the phase of the frequency divider circuit output CMP is later than that of the synchronizing signal FRM, then a frequency dividing ratio control signal UP is issued from the phase comparator circuit 201. The frequency dividing ratio control signal UP is output to control the frequency dividing ratio of the first frequency divider circuit to N−1; it is output for a preset, predetermined period of time.

Conversely, if the phase of the frequency divider circuit output CMP is earlier than that of the synchronizing signal FRM, then a frequency dividing ratio control signal DN is issued from the phase comparator circuit 201. The frequency dividing ratio control signal DN is output to control the frequency dividing ratio of the first frequency divider circuit to N+1; it is output for a preset, predetermined period of time.

For other period of time during which no control based UP or DN mentioned above is conducted, the frequency dividing ratio of the frequency divider circuit is set to N.

Thus, the DPLL circuit operates to maintain the state wherein the phase of the synchronizing signal FRM and that of the frequency divider circuit output CMP stay the same at all times. This operation permits the synchronization between the radio unit operating in accordance with the clock signal CK issued from the DPLL circuit and the digital network connecting unit issuing the synchronizing signal FRM.

When the digital network connecting unit is connected with the radio unit, the clock is turned ON/OFF at every phase comparison cycle.

The switching of the frequency dividing ratio of the DPLL circuit during transmission has been posing a problem in that the accuracy of the transmission speed is deteriorated and fails to meet a specified accuracy level.

There has been another problem in that the changeover of the frequency dividing ratio of the DPLL while a radio system is receiving data may cause a data receiving error.

SUMMARY OF THE INVENTION

The present invention has been made with a view toward solving the problems described above. A typical constitution in accordance with the present invention includes a phase control circuit for issuing a clock signal to a second device in response to a synchronizing signal supplied from a first device so as to synchronize the first device and the second device, the phase control circuit having a phase control stopping circuit that stops a phase control operation in response to a phase control disable signal issued by the second device.

According to another aspect of the present invention, there is provided a phase control method that includes a step for comparing a synchronizing signal and a signal to be controlled so as to detect a phase difference therebetween and a step for controlling the phase of the signal to be controlled in accordance with the phase difference before supplying the signal to a device, the phase control method further including a step for detecting a state wherein the device has been disabled to control the phase of the signal to be controlled, and a step for disabling the control of the phase of the signal to be controlled when the state has been engaged wherein the device has been disabled to control the phase of the signal to be controlled.

BRIEF DESCRIPTION OF THE DRAWINGS

FIG. 14 is a timing chart of the conventional circuit.

DESCRIPTION OF THE PREFERRED EMBODIMENTS (First Embodiment)

Figure 1:
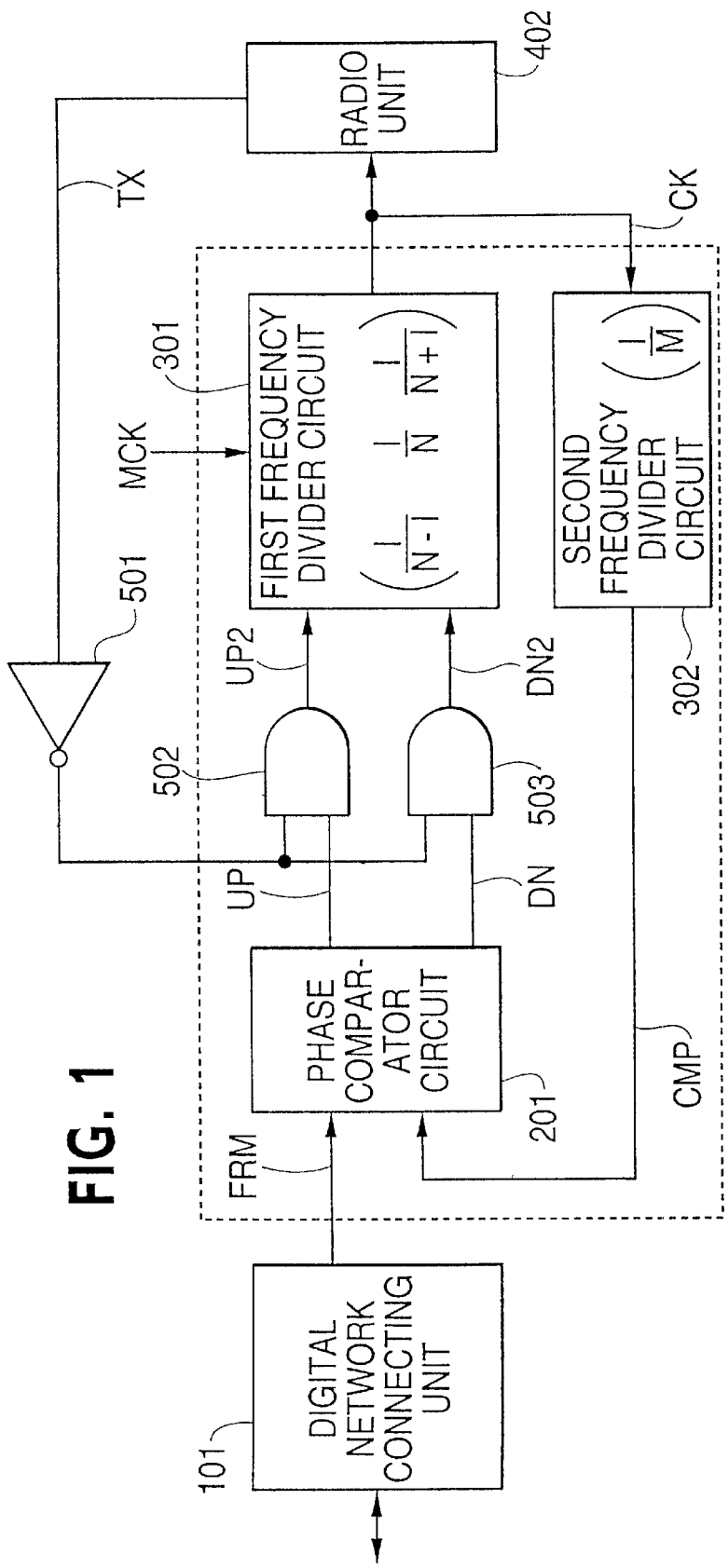
FIG. 1 is a circuit diagram of a first embodiment in accordance with the present invention.

FIG. 1 is a circuit diagram showing a phase control circuit that is a first embodiment of the present invention.

The main part of a DPLL circuit is surrounded by a dotted line in FIG. 1.

The digital network is connected to a digital network connecting unit 101. The synchronizing signal output from the digital network connecting unit 101 is connected to a first input terminal of a phase comparator circuit 201 of the DPLL circuit, a synchronizing signal FRM being applied to the phase comparator circuit 201.

A frequency dividing ratio control signal UP issued from the phase comparator circuit 201 is applied to a first input terminal of a first AND gate 502. The frequency dividing ratio control signal UP indicates a phase delay and it serves as a phase control signal. An output signal UP2 of the AND gate 502 is applied to a first input terminal of a first frequency divider circuit 301.

A frequency dividing ratio control signal DN issued from the phase comparator circuit is supplied to a first input terminal of a second AND gate 503. The frequency dividing ratio control signal DN indicates a phase advance and it serves as a phase control signal. An output signal DN2 of the AND gate 503 is applied to a second input terminal of a first frequency divider circuit 301.

A master clock signal MCK is the signal to be controlled; it is applied to the clock input terminal of the first frequency divider circuit 301.

A clock signal CK output from the first frequency divider circuit 301 is connected to the input terminal of a second frequency divider circuit 302 and the operating clock input terminal of a radio unit 402; an output signal CMP of the second frequency divider circuit 302 is supplied to the second input terminal of the phase comparator circuit 201.

A radio unit 402 issues a timing signal TX which indicates whether the radio unit 402 itself is ready for transmission and which is applied to an inverter 501. The signal output from the inverter 501 is applied to the second input terminal of the first AND gate 502 and that of the second AND gate 503.

Figure 2:
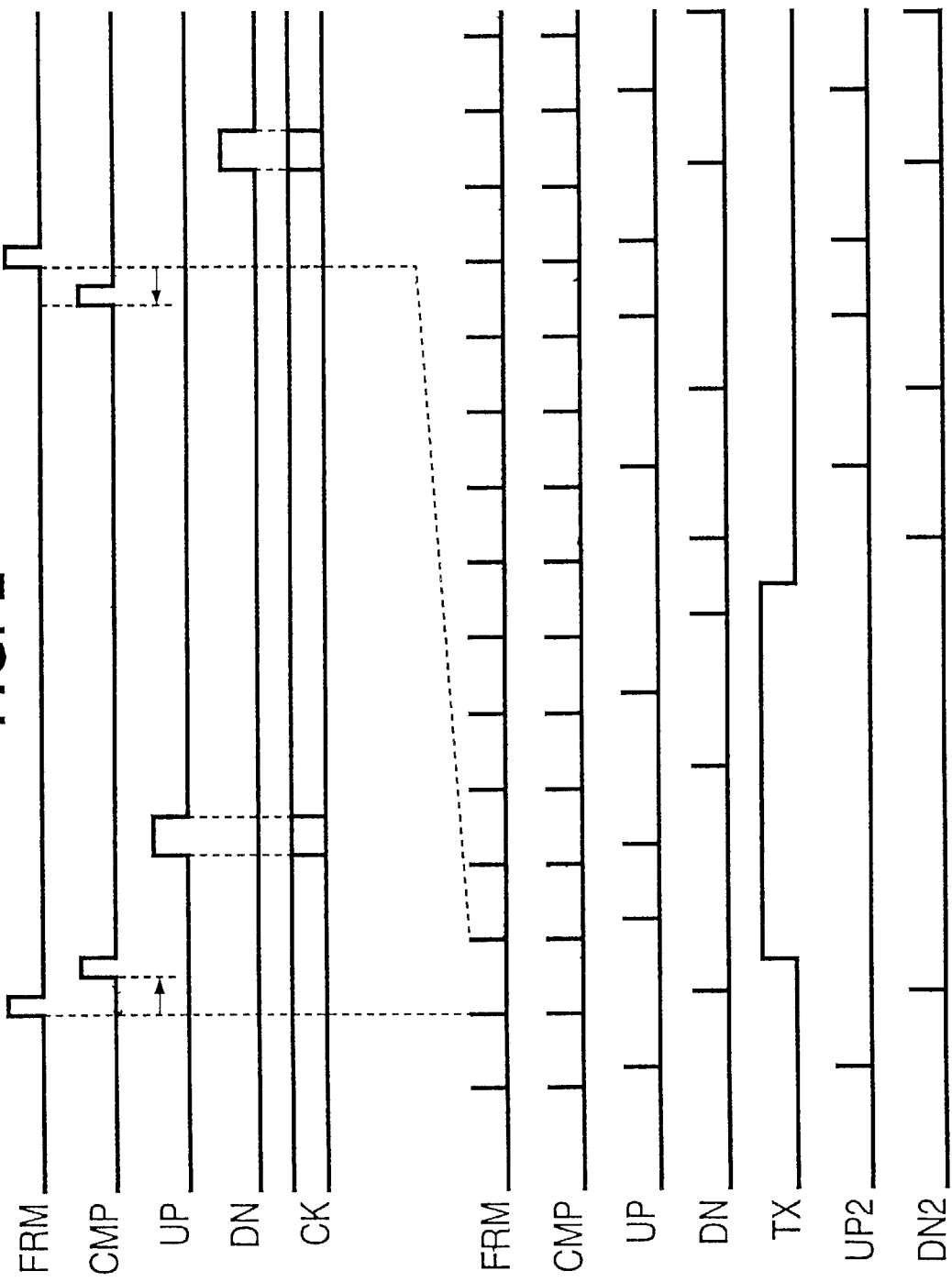
FIG. 2 is a timing chart of the first embodiment.

The operation of the DPLL circuit in accordance with the present invention will now be described in conjunction with the timing chart given in FIG. 2.

The normal operation wherein the radio unit 402 is not ready for transmission will be explained.

First, the phase comparator circuit 201 compares the phase of the synchronizing signal FRM issued from the digital network connecting unit with the phase of an output CMP of the second frequency divider circuit 302.

Using the synchronizing signal FRM as the reference, if the phase of the frequency divider circuit output signal CMP is delayed, then the phase comparator circuit 201 outputs the frequency dividing ratio control signal UP.

While the radio unit 402 is not ready for transmission, an L level signal is issued as the signal TX indicative of transmitting mode. Hence, H level signals are applied to the second input terminals of the AND gates 502 and 503 via the inverter 501.

In other words, for the period of time during which the frequency dividing ratio control signal UP is being output, an output signal UP2 of the AND gate 502 stays at the H level and it is applied to the frequency divider circuit 301.

Conversely, if the phase of the frequency divider circuit output CMP is earlier than that of the synchronizing signal FRM, the phase comparator circuit 201 outputs the frequency dividing ratio control signal DN. Just like the case where the frequency dividing ratio control signal UP was issued, an output signal DN2 of the AND gate 503 stays at the H level during the period of time during which the frequency dividing ratio control signal DN is being output and it is applied to the frequency divider circuit 301.

The output signals UP2 and DN2 of the AND gates 502 and 503, respectively, function to change the frequency dividing ratio of the frequency divider circuit 301; and the frequency divider circuit 301 changes the phase by changing the frequency dividing ratio.

The operation described above permits the synchronization between the radio unit operating in accordance with the clock signal CK issued from the DPLL circuit and the digital network connecting unit issuing the synchronizing signal FRM.

The operation wherein the radio unit 402 is ready for transmission will now be explained.

When the radio unit 402 is ready for transmission, the signal TX goes to the H level.

If the signal TX emitted from the radio unit 402 is H level, then the L level signals are being applied to the second input terminals of the AND gates 502 and 503 via the inverter 501.

In other words, during the period of time in which TX is at the H level, the L level signals are always applied to the second input terminals of the AND gates 502 and 503. Therefore, the signals UP2 and DN2 output from the AND gates 502 and 503 are always L level whether the frequency dividing ratio control signal UP or DN is output at the H level or the L level from the phase comparator circuit 201. This means that, even if the phase comparator circuit 201 is issuing the signal UP or DN for controlling the frequency dividing ratio, the signal will be masked by the AND gates 502 and 503 and will not be transmitted to the frequency divider circuit 301.

In other words, the signal TX indicating that the radio unit 402 is ready for transmission functions to disable the phase control by DPLL. Thus, the frequency dividing ratio of the frequency divider circuit 301 stays constant regardless of the result of the comparison between the synchronizing signal FRM and the frequency divider circuit output CMP.

As explained above, according to the first embodiment, the phase control is not conducted while the radio unit is ready for transmission, so that the frequency dividing ratio remains unchanged at the time of transmission, eliminating the possibility of transmission speed accuracy being deteriorated to fail to meet the requirement.

(Second Embodiment)

Figure 3:
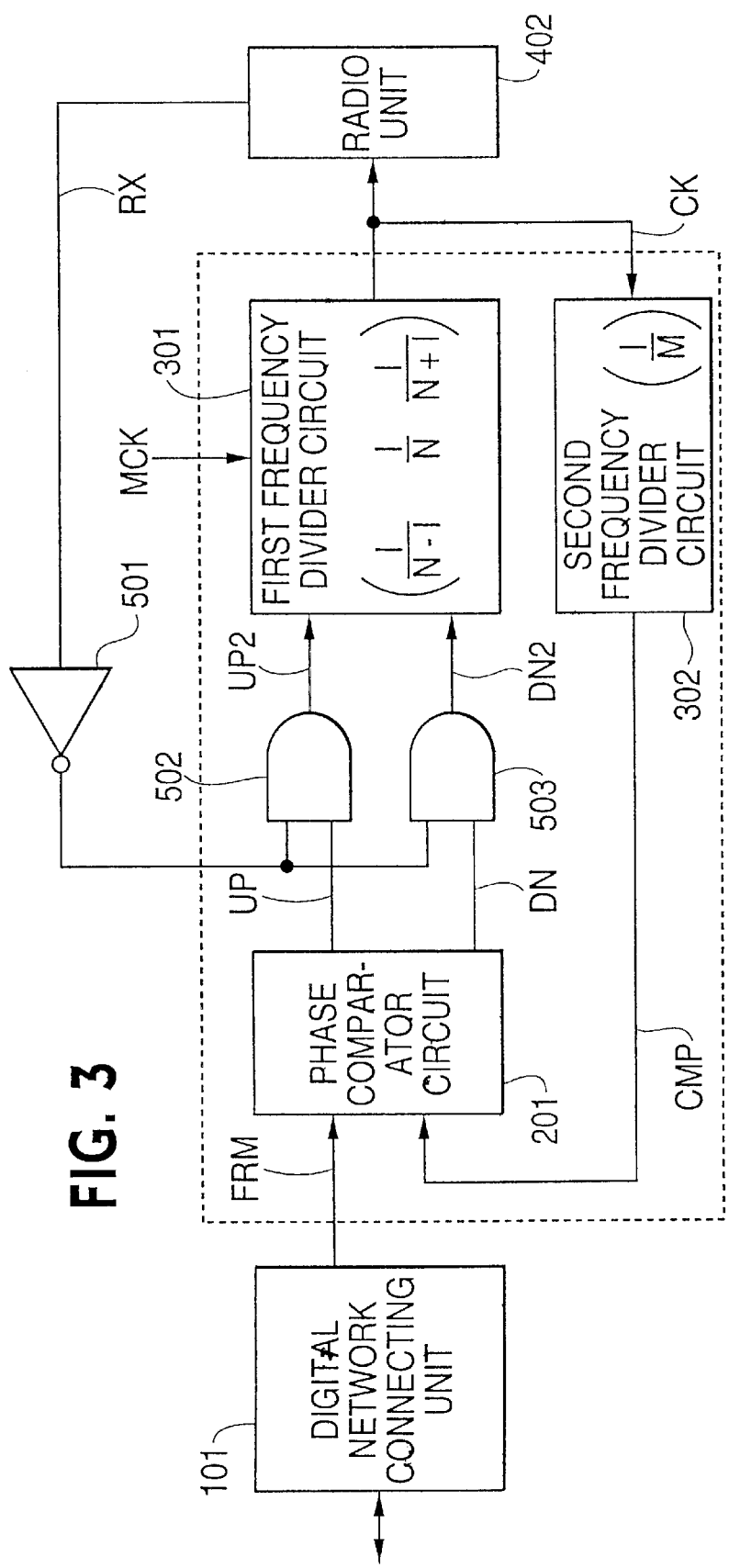
FIG. 3 is a circuit diagram of a second embodiment in accordance with the present invention.

FIG. 3 is a circuit diagram showing a phase control circuit of a second embodiment in accordance with the present invention.

The main part of a DPLL circuit is surrounded by a dotted line in FIG. 3.

The basic configuration of the DPLL circuit of the second embodiment in accordance with the present invention is substantially identical to that of the DPLL circuit of the first embodiment except that the radio unit 402 issuing the timing signal TX indicating the transmitting mode in the first embodiment has been replaced with a radio unit 403 which issues a timing signal RX indicating receiving mode.

Figure 4:
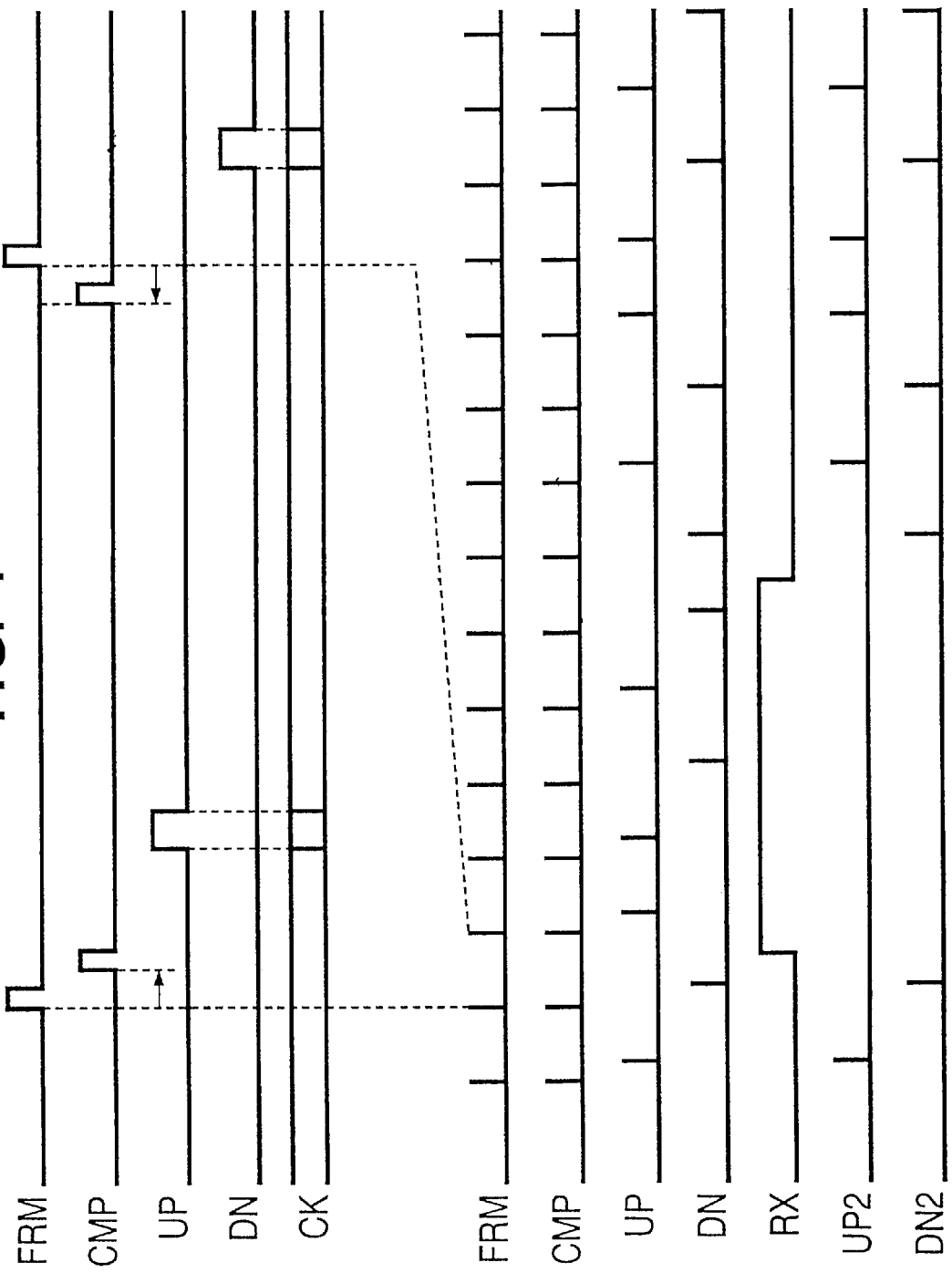
FIG. 4 is a timing chart of the second embodiment.

The operation will be explained in conjunction with the timing chart given in FIG. 4.

The operation is substantially the same as that of the first embodiment except that the frequency dividing ratio of the frequency divider circuit 301 is fixed to N according to RX denoting the timing signal that indicates the receiving mode in the second embodiment, while the frequency dividing ratio of the frequency divider circuit is fixed to N according to the signal TX indicating the transmitting mode in the first embodiment.

Thus, according to the second embodiment, since the phase control is not carried out while the radio unit is receiving signals, the frequency dividing ratio of DPLL is not changed, making it possible to prevent data receiving errors.

(Third Embodiment)

Figure 5:
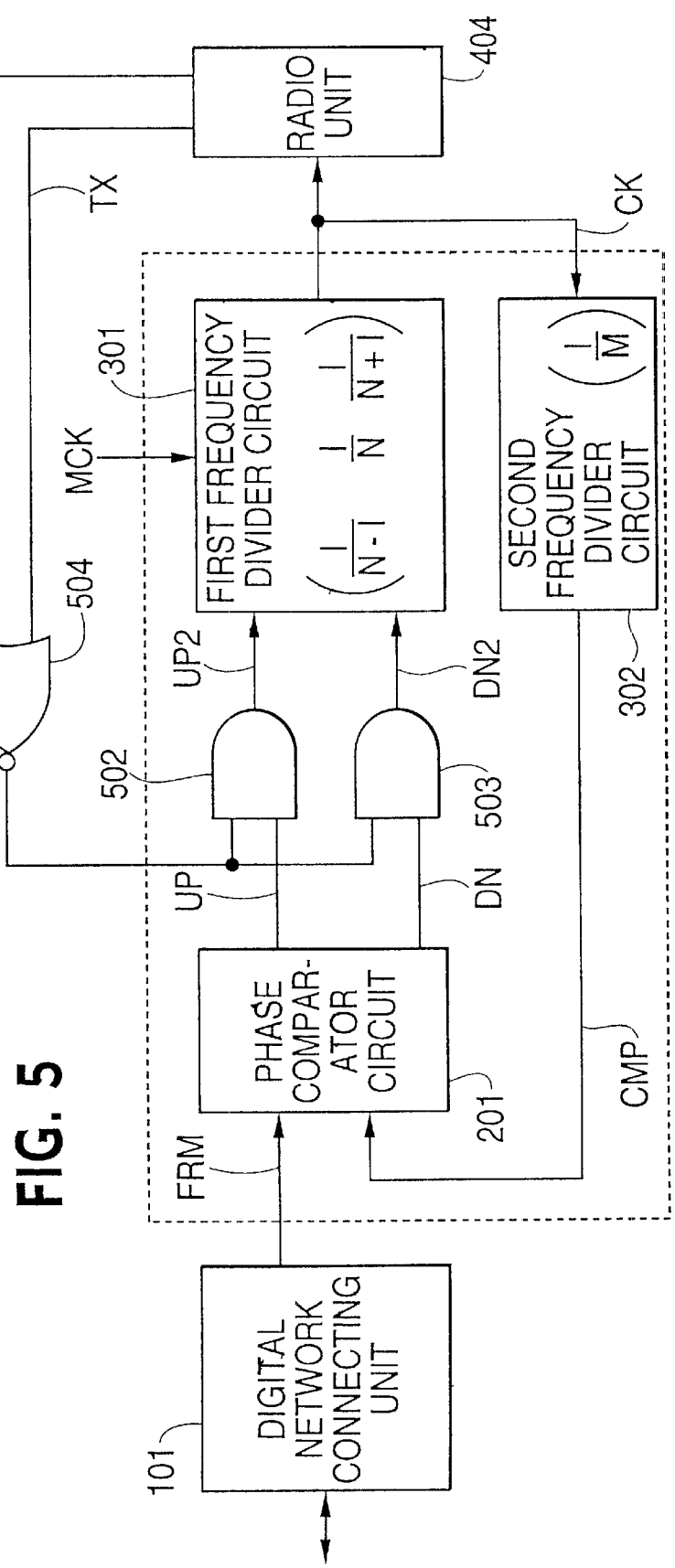
FIG. 5 is a circuit diagram of a third embodiment in accordance with the present invention.

FIG. 5 is a circuit diagram showing a phase control circuit of a third embodiment in accordance with the present invention.

The main part of a DPLL circuit is surrounded by a dotted line in FIG. 5.

In the third embodiment, the radio unit 402 that outputs the timing signal TX indicative of the transmitting mode in the first embodiment has been replaced with a radio unit 404 that outputs both the timing signal TX indicative of the transmitting mode and the timing signal RX indicative of the receiving mode. Further, the inverter 501 in the first embodiment has been replaced with a NOR gate 504; supplied to the input terminal of the NOR gate 504 are the timing signal TX which indicates the transmitting mode and the timing signal RX which indicates the receiving mode, both signals being output from the radio unit 404. The signals output from the NOR gate 504 are supplied to the second input terminals of a first AND gate 502 and a second AND gate 503, respectively.

Figure 6:
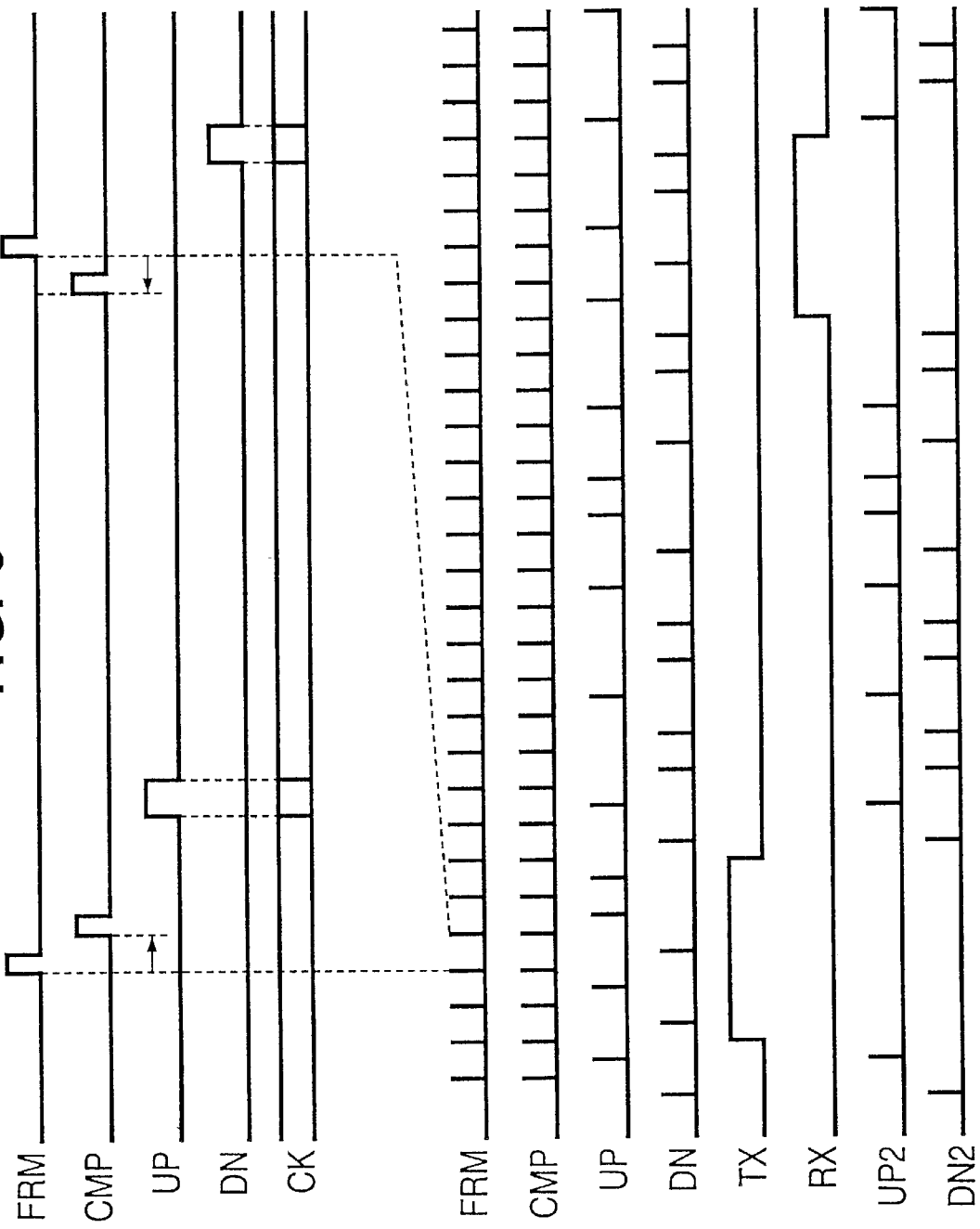
FIG. 6 is a timing chart of the third embodiment.

The operation of the DPLL circuit in accordance with the present invention will be described in conjunction with the timing chart shown in FIG. 6.

The description will be given to the normal operation wherein the radio unit 404 is neither ready for transmission nor ready for receiving. When the radio unit 404 is performing normal operation, both the TX signal indicative of the transmitting mode and the RX signal indicative of the receiving mode, that are being issued, are the L level. Hence, H level signals are being applied to the second input terminals of the AND gates 502 and 503, respectively, via the NOR gate 504.

At this time, a phase comparator circuit 201 compares the phase of a synchronizing signal FRM issued from a digital network connecting unit and the phase of an output CMP of a second frequency divider circuit 302.

If the phase of the output CMP of the frequency divider circuit is later than the synchronizing signal FRM, then the phase comparator circuit 201 outputs a frequency dividing ratio control signal UP. If both the TX signal indicative of the transmitting mode and the RX signal indicative of the receiving mode are L level, then an output signal UP2 of the AND gate 502 is also H level and it is supplied to the frequency divider circuit 301 during a period of time when the frequency dividing ratio control signal UP is being issued because the H level signal is being applied to the second input terminal of the AND gate 502.

If the phase of the output CMP of the frequency divider circuit is earlier than the phase of the synchronizing signal FRM, then the phase comparator circuit 201 issues a frequency dividing ratio control signal DN. As in the case where the frequency dividing ratio control signal UP is being issued, an output signal DN2 of the AND gate 503 goes to the H level and the H level output signal DN2 is supplied to the frequency divider circuit 301 while the frequency dividing ratio control signal DN is being issued.

The output signals UP2 and DN2 from the AND gates 502 and 503 both change the frequency dividing ratio of the frequency divider circuit 301.

A case where non-normal operation is performed will now be explained.

When the radio unit 404 is in the transmitting mode, that is, when the signal TX output from the radio unit 404 is H level, the signal RX indicative of the receiving mode is naturally L level. On the other hand, when the radio unit 404 is in the receiving mode, that is, when the signal RX issued from the radio unit 404 is H level, the signal TX indicative of the transmitting mode is L level.

In other words, if the radio unit is either in the transmitting mode or receiving mode, the signals output through the NOR gate 504 are L level.

Therefore, regardless of whether the frequency dividing ratio control signal UP or DN issued from the phase comparator circuit 201 is H level or L level, the output signals UP2 and DN2 from the AND gates 502 and 503 are always L level.

This means that if the radio unit 404 is in the transmitting mode or the receiving mode, then the frequency dividing ratio of the frequency divider circuit 301 stays constant regardless of the result of comparison between the synchronizing signal FRM and the frequency divider circuit output CMP.

Thus, according to the third embodiment, the phase control is not carried out while the radio unit in the transmitting mode or the receiving mode; hence, the transmission speed accuracy at the time of transmission does not lower below the requirement and it is also possible to prevent receiving data errors caused by changing the frequency dividing ratio during receiving.

(Fourth Embodiment)

Figure 7:
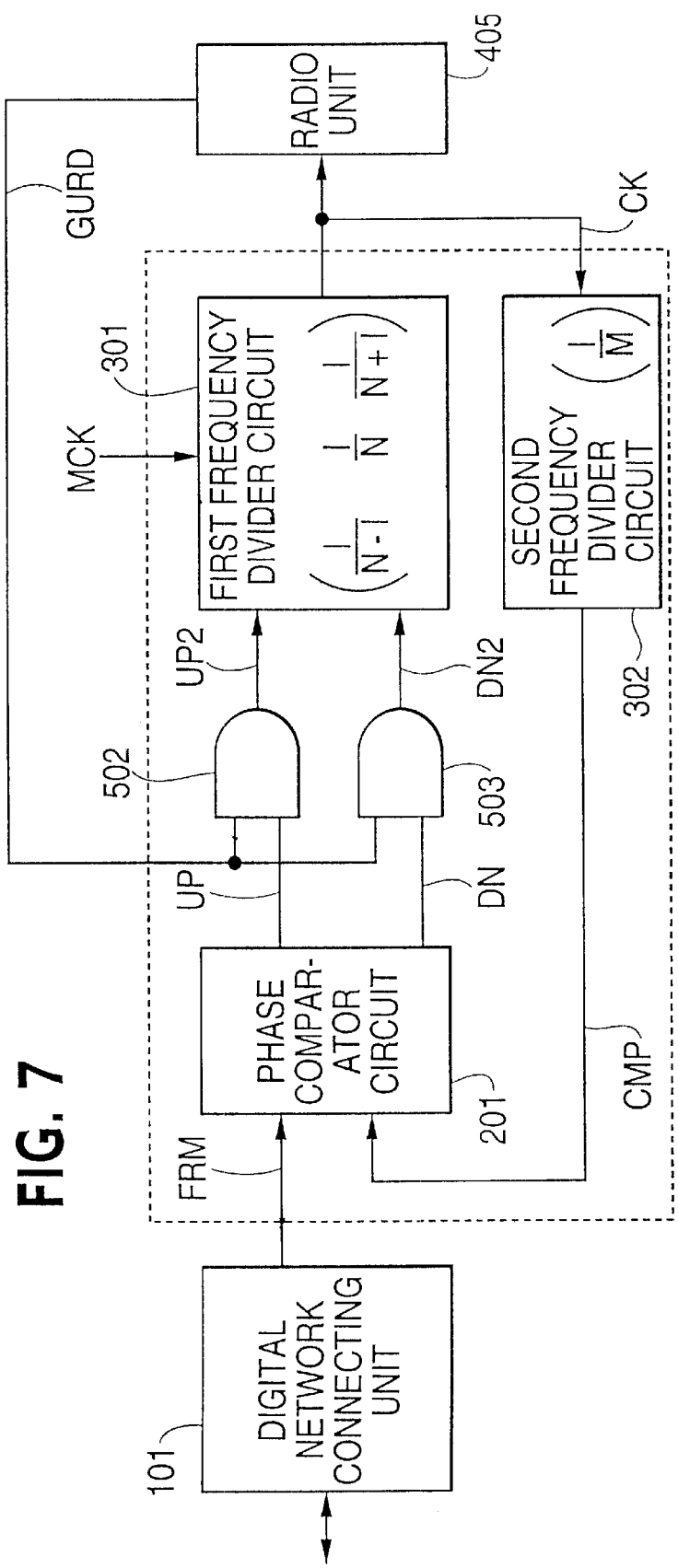
FIG. 7 is a circuit diagram of a fourth embodiment in accordance with the present invention.

FIG. 7 is a circuit diagram showing a phase control circuit of a fourth embodiment in accordance with the present invention.

The main part of a DPLL circuit is surrounded by a dotted line in FIG. 7.

In the radio unit in accordance with the invention, there are cases where the radio unit is placed in the transmitting mode or the receiving mode at all times. In such a radio unit, however, a guard timing is provided between adjacent transmitting or receiving timings so as to prevent adjacent signals from overlapping each other.

The fourth embodiment shares the same basic configuration as that of the first embodiment except that a radio unit 405 that outputs a timing signal GURD indicative of the aforesaid guard timing replaces the radio unit 402 that outputs the timing signal TX indicative of the transmission mode in the first embodiment.

The timing signal GURD which indicates the guard timing and which is issued from the radio unit 405 is applied to a second input terminal of an AND gate 502 and a second input terminal of an AND gate 503.

Figure 8:
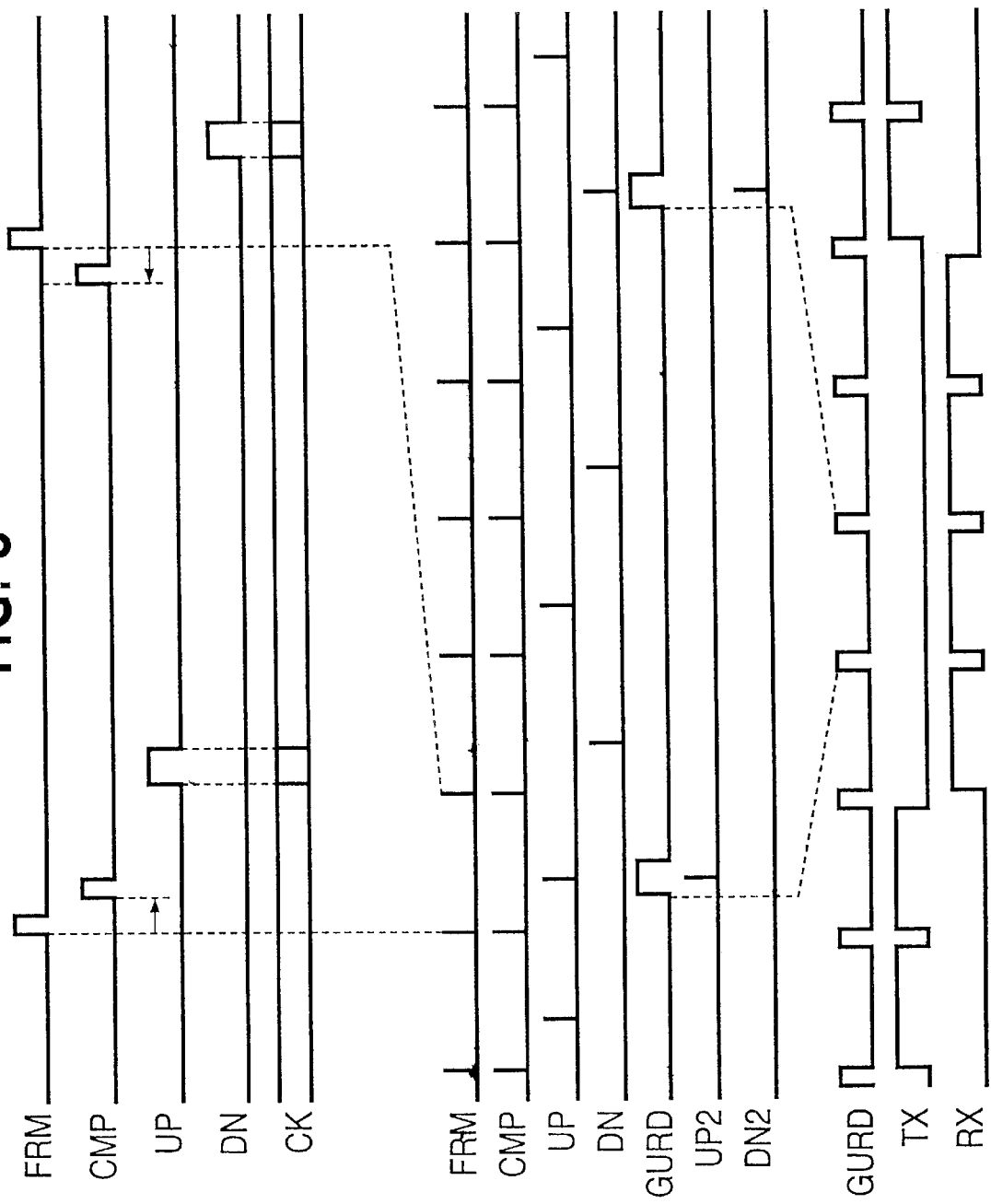
FIG. 8 is a timing chart of the fourth embodiment.

The operation will be explained in conjunction with the timing chart shown in FIG. 8.

When the radio unit 405 is not at the guard timing, that is, when the timing signal GURD issued is L level, the L level signal is applied to the second input terminals of the AND gates 502 and 503.

Thus, regardless of whether a frequency dividing ratio control signal UP or DN issued from a phase comparator circuit 201 is H level or L level, output signals UP2 and DN2 from the AND gates 502 and 503 are always L level.

When the radio unit 405 is at the guard timing, that is, when the timing signal GURD is H level, the H level signal is applied to the second input terminals of the AND gates 502 and 503. Hence, the AND gates 502 and 503 output UP2 or DN2 to control the frequency dividing ratio according to a frequency dividing ratio control signal UP or DN issued from the phase comparator circuit 201.

In other words, the signal GURD indicative of the guard timing works as the signal enabling the DPLL circuit to conduct the phase control.

Thus, according to the fourth embodiment, even when the radio unit is likely to be set in the transmitting mode or the receiving mode at all times, it is possible not to conduct the phase control in the transmitting or receiving mode. Furthermore, the transmission speed accuracy at the time of transmission does not lower below the requirement and it is also possible to prevent receiving data errors caused by changing the frequency dividing ratio during receiving.

(Fifth Embodiment)

Figure 9:
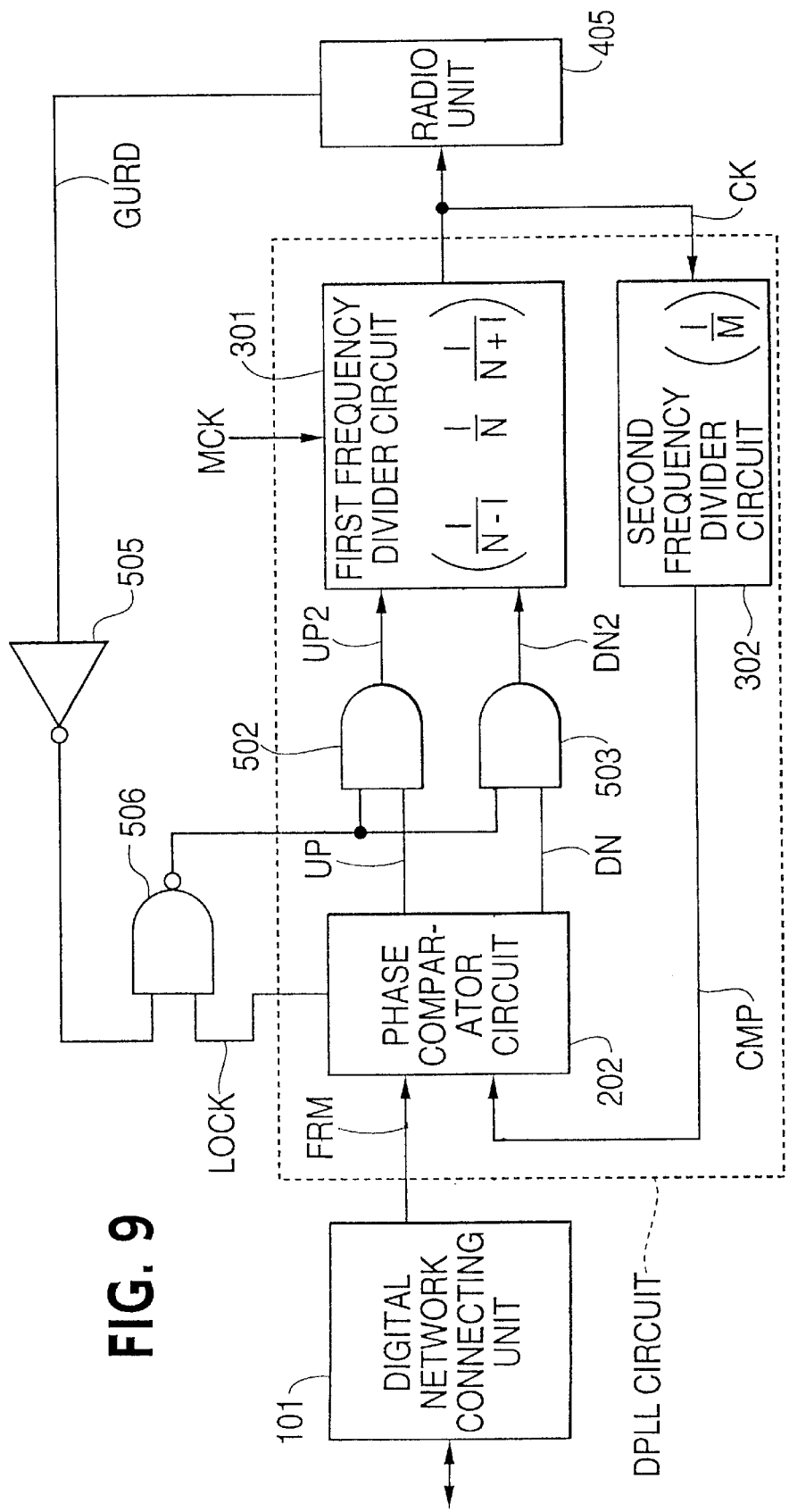
FIG. 9 is a circuit diagram of a fifth embodiment in accordance with the present invention.

FIG. 9 is a circuit diagram showing a phase control circuit of a fifth embodiment in accordance with the present invention.

The main part of a DPLL circuit is surrounded by a dotted line in FIG. 9.

In the first through third embodiments, the frequency dividing ratio control of the frequency divider circuit is not conducted in the transmitting or receiving mode. In the fourth embodiment, the frequency dividing ratio control of the frequency divider circuit is carried out only during the guard timing period of time, and the frequency dividing ratio control of the frequency divider circuit is not carried out at any other timings.

When, however, a long period of time during which the frequency dividing ratio control is not conducted is allowed, there is a likelihood that it undesirably takes a long time before the difference between the phase of a frequency divider circuit output CMP and the phase of a synchronizing signal FRM goes down to a predetermined level or lower, i.e. reaches a locked state.

Thus, in the fifth embodiment, the phase comparator circuit 201 in the first through fourth embodiments has been replaced with a phase comparator circuit 202 that issues a lock detection signal LOCK indicating that the DPLL circuit is locked when the phase difference between the synchronizing signal FRM and the frequency divider circuit output CMP is within a predetermined range. The lock detection signal LOCK is applied to a first input terminal of a NAND gate 506, while a timing signal GURD indicating that it is the guard timing issued from the radio unit 405 is applied as /GURD via an inverter 505 to a second input terminal of the NAND gate 506.

An output signal of the NAND gate 506 is applied to the second input terminals of AND gates 502 and 503.

Figure 10:
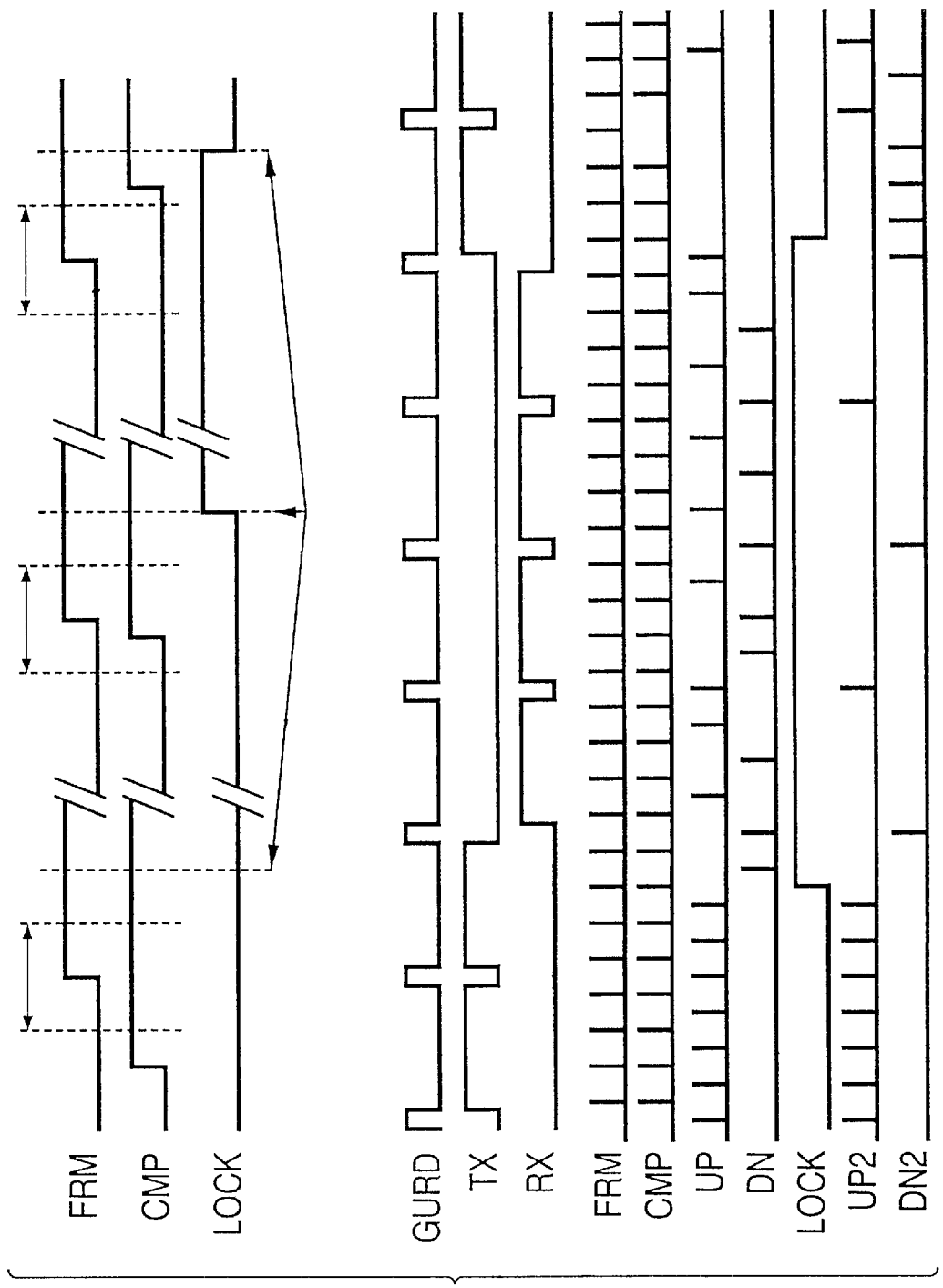
FIG. 10 is a timing chart of the fifth embodiment.

The rest of the configuration of this embodiment is identical to the configurations of those of other embodiments The operation will now be explained in conjunction with the timing chart given in FIG. 10.

If the DPLL circuit is not locked, i.e. if there is a big phase difference between the synchronizing signal FRM and the frequency divider circuit output CMP, then the lock detection signal LOCK issued from the phase comparator circuit 202 is L level. Hence, the signals output from the NAND gate 506 is H level regardless of the level of /GURD.

In other words, while the DPLL circuit is not in the locked state, H level signals are applied to the second input terminals of the AND gates 502 and 503. Therefore, the AND gates 502 and 503 output UP2 or DN2 to control the frequency dividing ratio of the frequency divider circuit 301 in accordance with a frequency dividing ratio control signal UP or DN issued from the phase comparator circuit 202.

When the DPLL circuit is in the locked state, i.e. when the phase difference between the synchronizing signal FRM and the frequency divider circuit output CMP has lowered to a predetermined value or lower, then the lock detection signal LOCK issued from the phase comparator circuit 202 is H level. Thus, the level of the signal issued from the NAND gate 506 changes in accordance with the level of /GURD.

More specifically, the signal issued from the NAND gate 506 goes to L level when /GURD is H level, whereas it goes to H level when /GURD is L level.

In other words, when the DPLL circuit is in the locked state, the H level signals are applied to the second input terminals of the AND gates 502 and 503 only at the guard timing when the timing signal GURD indicative of the guard timing is H level.

Accordingly, when the DPLL circuit is in the locked state, it operates in the same manner as that of the fourth embodiment.

Thus, the fifth embodiment solves the problem in that allowing a long period time during which no frequency dividing ratio control is conducted causes a longer lead time than necessary before the DPLL circuit is locked as in the case of the first through fourth embodiments. In the state where the DPLL circuit is locked, it is possible not to carry out the phase control in the transmitting or receiving mode, so that the fifth embodiment also provides the advantage in that the transmission speed accuracy at the time of transmission does not lower below the requirement and receiving data errors caused by changing the frequency dividing ratio during receiving can be prevented.

Moreover, even if the locked state should be accidentally released for some reason, the locked state can be quickly restored.

In this embodiment, the description has been given by referring to the circuit which operates similarly to that of the fourth embodiment; however, the circuit can be modified so that it operates similarly to the circuits of the first through third embodiments by changing the logic gates as necessary.

(Sixth Embodiment)

Figure 11:
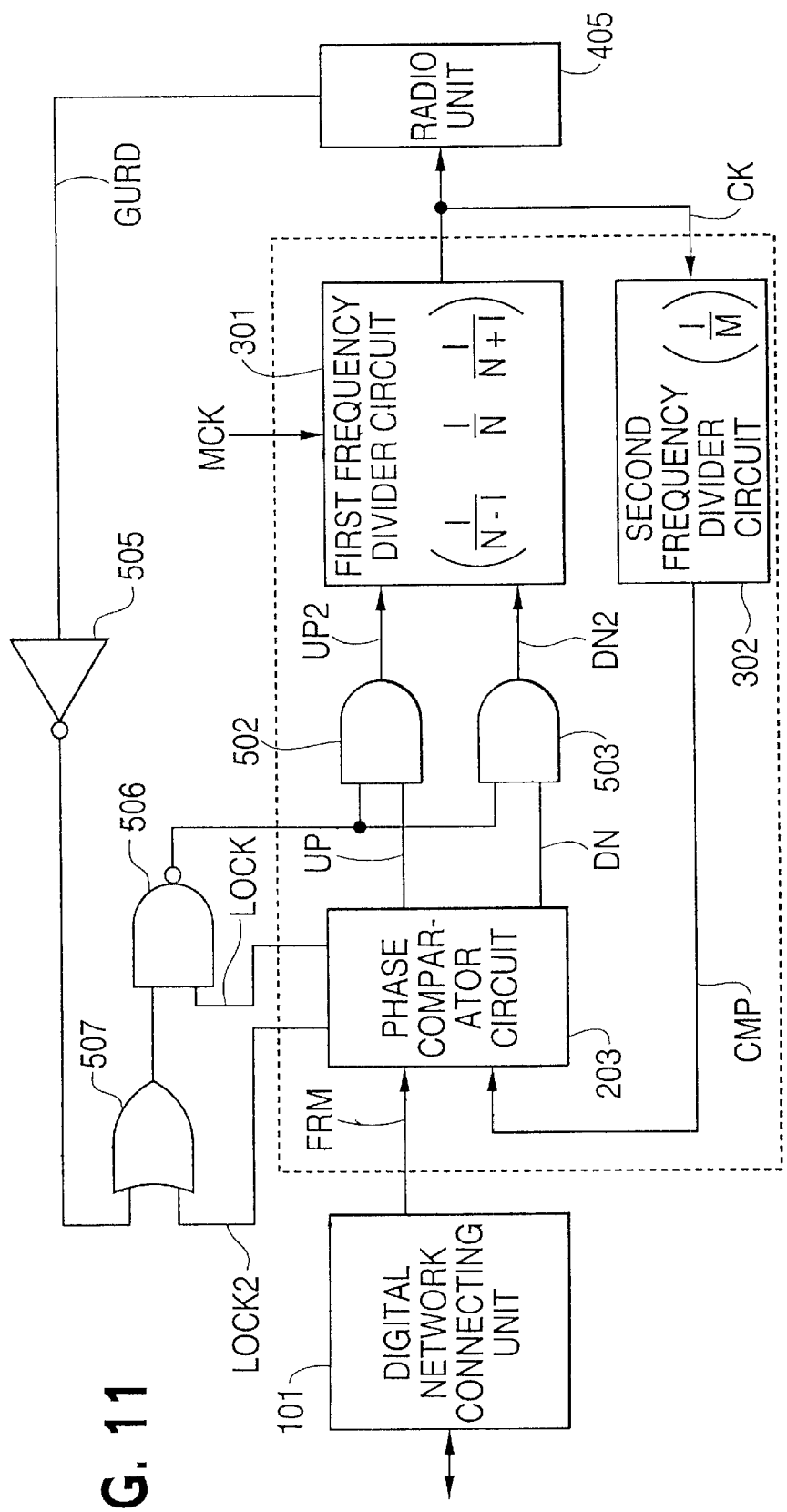
FIG. 11 is a circuit diagram of a sixth embodiment in accordance with the present invention.

FIG. 11 is a circuit diagram showing a phase control circuit of a sixth embodiment in accordance with the present invention.

The main part of a DPLL circuit is surrounded by a dotted line in FIG. 11.

In the first through fifth embodiments, when a phase difference is detected between the synchronizing signal FRM and the frequency divider circuit output CMP, the detection result is output from the phase comparator circuit as the frequency dividing ratio control signal UP or DN regardless of the size of the phase difference. The frequency dividing ratio control signals are transmitted to the frequency divider circuit as UP2 or DN2 via the AND gates 502 and 503 except during the period of time when the timing at which the frequency dividing ratio control signal UP or DN is issued is the one prohibiting the implementation of the frequency dividing ratio control, namely, in the transmitting or receiving mode. This means that the frequency dividing ratio control is carried out even when there is not much phase difference and there is no need to carry out the frequency dividing ratio control.

To solve the above problem, in the sixth embodiment, the phase comparator circuit of the fifth embodiment has been replaced with a phase comparator circuit 203 that issues a first lock detection signal LOCK indicating that the DPLL circuit has been locked when the phase difference between the synchronizing signal FRM and the frequency divider circuit output CMP is within a first set range and a second lock detection signal LOCK2 indicating that the phase difference between the synchronizing signal FRM and the frequency divider circuit output CMP is within a second set range and the DPLL circuit is locked with a small phase difference.

The first lock detection signal LOCK is applied to a first input terminal of a NAND gate 506. A timing signal GURD which is issued from a radio unit 405 and which indicates a guard timing is supplied to an inverter circuit 505 and the output signal of the inverter 505 is supplied to a first input terminal of an OR gate 507. The second lock detection signal LOCK2 is supplied to a second input terminal of the OR gate 507; and the output signal of the OR gate 507 is applied to a second input terminal of the NAND gate 506.

The output signals of the NAND gate 506 are supplied to the second input terminals of AND gates 502 and 503.

The rest of the configuration of this embodiment is identical to the configuration of any of other embodiments.

Figure 12:
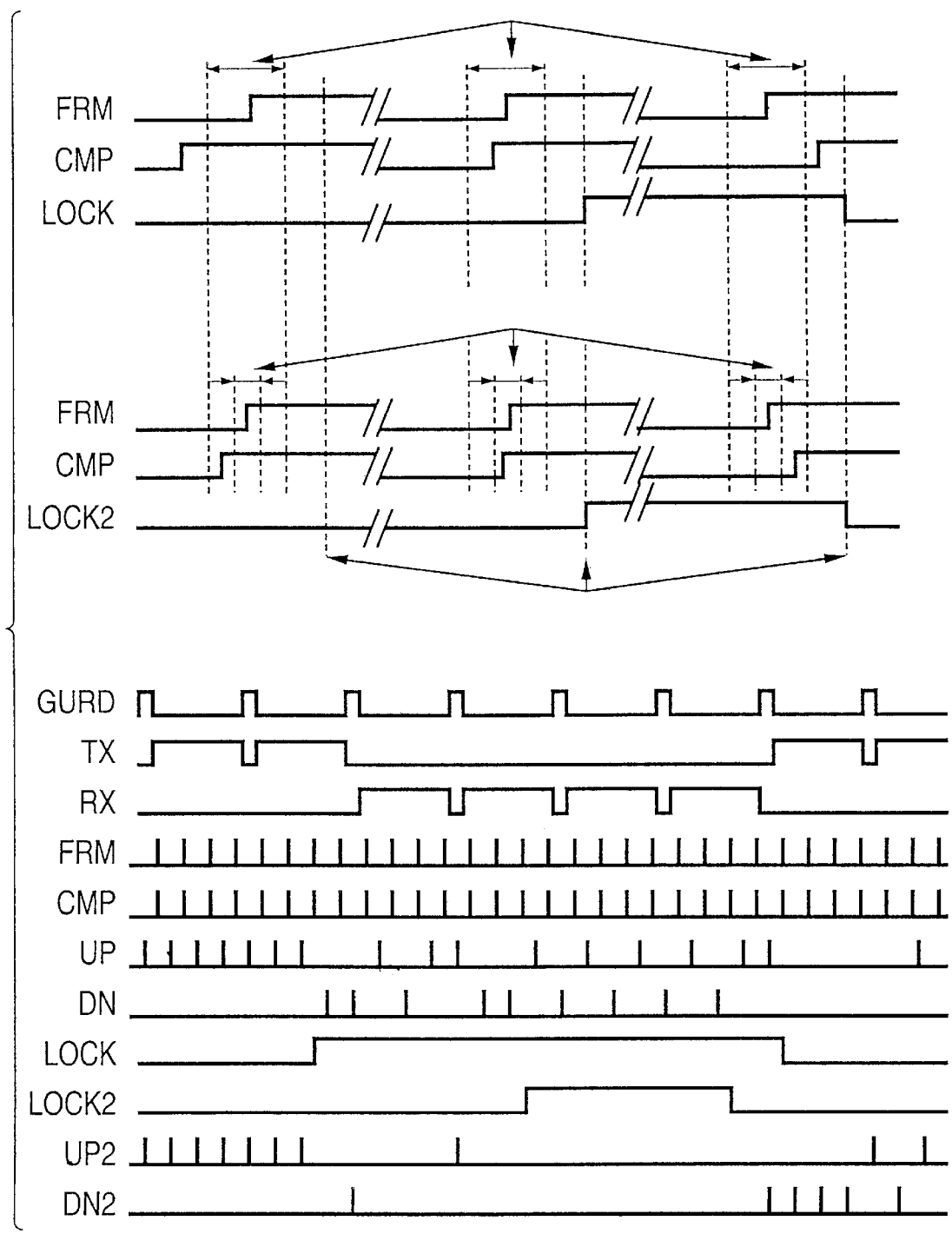
FIG. 12 is a timing chart of the sixth embodiment
Figure 13:
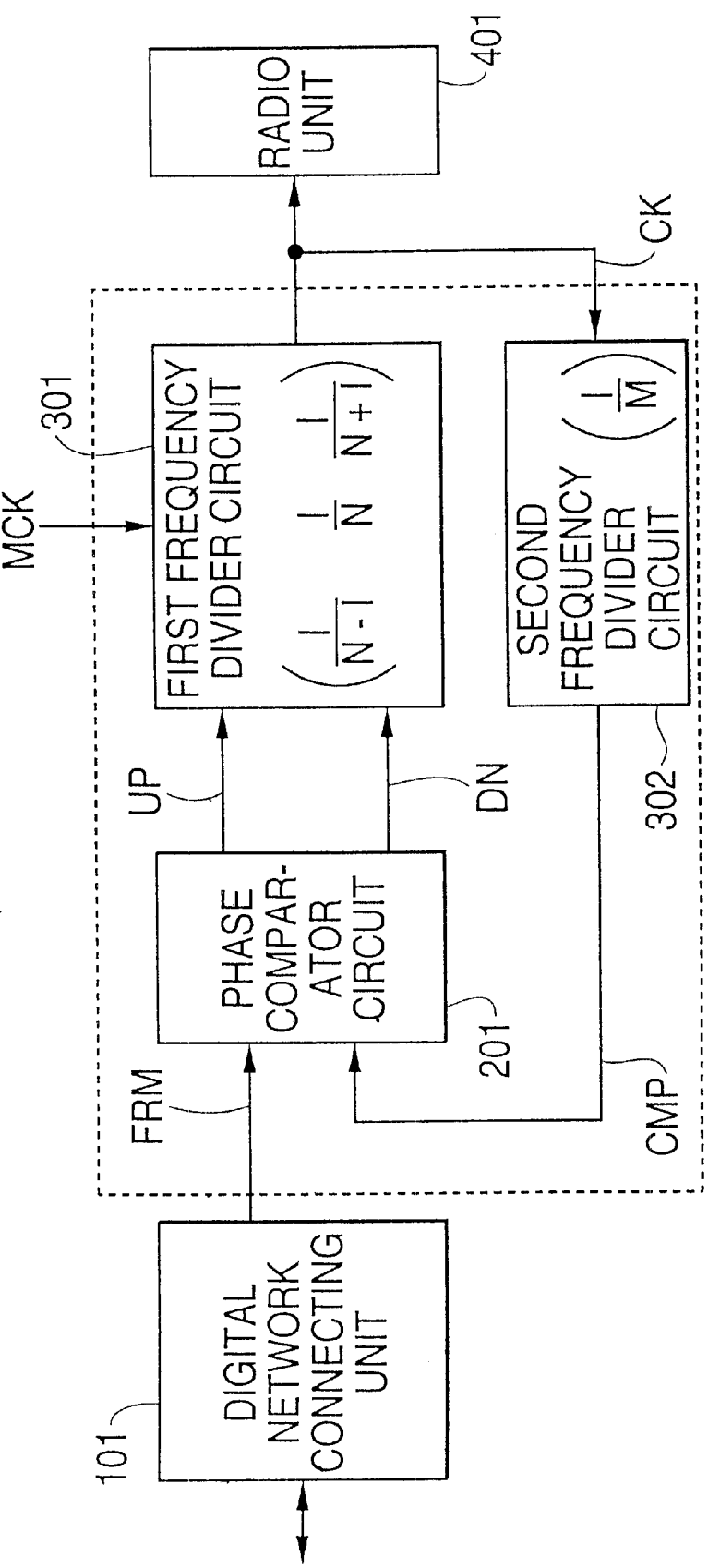
FIG. 13 is a diagram of a conventional circuit.

The operation will now be described by referring to the timing chart given in FIG. 12.

When the DPLL circuit is not in the locked state, that is, when the phase difference between the synchronizing signal FRM and the frequency divider circuit output CMP is larger than a first predetermined level, the first lock detection signal LOCK output from the phase comparator circuit 203 is L level. Hence, the signals output from the NAND gate 506 are H level regardless of the level of the signals applied to the second input terminal thereof.

More specifically, when the DPLL circuit is not in the locked state, H level signals are supplied to the second input terminals of the AND gates 502 and 503; therefore, the AND gates 502 and 503 output UP2 or DN2 to control the frequency dividing ratio of a frequency divider circuit 301 in accordance with a frequency dividing ratio control signal UP or DN issued from the phase comparator circuit 203.

When the phase difference between the synchronizing signal FRM and the frequency divider circuit output CMP has become lower than the first predetermined value, the first lock detection signal LOCK issued from the phase comparator circuit 203 goes to H level.

At this time, the signal output from the NAND gate 506 changes according to the signal applied to the second input terminal of the NAND gate 506.

The signal applied to the second input terminal of the NAND gate 506 is the signal output from the OR gate 507.

In this case, when the phase difference between the synchronizing signal FRM and the frequency divider circuit output CMP is larger than the second predetermined value, the second lock detection signal LOCK2 issued from the phase comparator circuit 203 is L level and it is supplied to the first input terminal of the OR gate 507.

Thus, the signal output from the OR gate 507 takes over the level of the signal applied to the second input terminal of the OR gate 507. This is the signal /GURD obtained by inverting a signal GURD issued from a radio unit by an inverter 505.

According to the circuit configuration of this embodiment, the same operation as that of the foregoing fifth embodiment is performed when the phase difference between the synchronizing signal FRM and the frequency divider circuit output CMP lies between the first predetermined value and the second predetermined value.

If the phase difference between the synchronizing signal FRM and the frequency divider circuit output CMP is less than the second predetermined value, the second lock signal LOCK2 issued from the phase comparator circuit 203 is H level.

Hence, an H level signal is applied to the second input terminal of the NAND gate 506. This automatically means that the signal LOCK applied to the first input terminal is also H level; therefore, the output of the NAND gate 506 becomes L level, and L level signals are applied to the second input terminals of the AND gates 502 and 503.

Thus, if the second predetermined value is smaller than the first predetermined value, and the phase difference between the synchronizing signal FRM and the frequency divider circuit output CMP is smaller than the second predetermined value, then signals UP2 and DN2 issued from the AND gates 502 and 503 are L level, and no frequency dividing ratio adjustment in the frequency divider circuit 301 is made.

As described above, the sixth embodiment makes it possible not to carry out the frequency dividing ratio control when the phase difference is so small that it does not require frequency dividing ratio control. This permits higher stability of clocks when the DPLL circuit is locked.

In the present invention, the description has been given on the assumption that the phase comparator circuit compares the phases of the rising edges of the synchronizing signal FRM and the frequency divider circuit output CMP, respectively; however, the circuit may alternatively be configured to compare the phases of falling edges or the phases of both rising and falling edges.

The synchronizing signal FRM and the output CMP of the frequency divider circuit have been compared. Alternatively, however, the synchronizing signal may be compared with a clock, or second and third frequency divider circuits may be provided; there is no limit on the number of frequency divider circuits provided.

In the embodiment, the second frequency divider circuit has been provided; however, only the first frequency divider circuit may be provided.

Likewise, the output of the first frequency divider circuit has been used as the clock for the radio unit; however, the output of other frequency divider circuit may be employed as the clock for the radio unit.

In the embodiment, the frequency dividing ratio control has been implemented once for one phase comparison; however, the frequency dividing ratio control may alternatively be implemented for a plurality of times.

Further, in the embodiment, the change of the frequency dividing ratio of the first frequency divider circuit carrying out the frequency dividing ratio control has been set to ±1; however, the value is not limited to the one used in this embodiment.

In the embodiment, one frequency divider circuit carrying out the frequency dividing ratio control has been provided; however, the number of the frequency divider circuit is not limited to the one described in the embodiment.

The logics of the symbols or the configurations of the logic circuits are not limited to those in the embodiments; they may be modified within the scope of the control method described herein.

What is claimed is:

1. A phase control circuit comprising:

a phase comparing circuit which compares respective phases of a synchronizing signal and an internal signal, and which outputs a phase control signal indicative of a comparison result;

a phase changing circuit which changes the phase of said internal signal according to said phase control signal, and which outputs the internal signal having the changed phase to a radio unit for synchronizing the radio unit; and a mask circuit which is responsive to an operational mode of the radio unit, and which selectively stops a supply of said phase control signal from said phase comparing circuit to said phase changing circuit in response to a phase control disable signal received from the radio unit when at least one of a transmitting mode and a receiving mode is indicated.

2. The phase control circuit according to claim 1, wherein said phase comparator outputs said phase control signal as an up signal when the phase of said internal signal is delayed relative the phase of said synchronizing signal, and as a down signal when the phase of said internal signal precedes the phase of said synchronizing signal.

3. The phase control circuit according to claim 2, wherein said mask circuit comprises a first logic circuit which outputs said up signal having a first voltage level to said phase changing circuit when said up signal has a first voltage level and when said phase control disable signal has a second voltage level, and a second logic circuit which outputs said down signal having a first voltage level to said phase changing circuit when said down signal has a first voltage level and when said phase control disable signal has a second voltage level.

4. The phase control circuit according to claim 3, wherein said phase changing circuit selects a large frequency dividing ratio large when said up signal has a first voltage level, said phase changing circuit selects a small frequency dividing ratio when said down signal has a first voltage level.

5. The phase control circuit comprising:
a phase comparing circuit which compares respective phases of a synchronizing signal and an internal signal, and which outputs a phase control signal indicative of a comparison result;
a phase changing circuit which changes the phase of said internal signal according to said phase control signal, and which outputs the internal signal having the changed phase to a radio unit for synchronizing the radio unit; and
a mask circuit which is responsive to an operational mode of the radio unit, and which selectively supplies said phase control signal to said phase changing circuit according to a voltage level of a guard timing signal received from the radio unit, wherein the guard timing signal indicates a guard timing term during a transmitting mode or a receiving mode of the radio unit.

6. The phase control circuit according to claim 5, wherein said phase comparator outputs said phase control signal as an up signal when the phase of said internal signal is delayed relative the phase of said synchronizing signal, and as a down signal when the phase of said internal signal precedes the phase of said synchronizing signal.

7. The phase control circuit according to claim 6, wherein said mask circuit comprises a first logic circuit which outputs said up signal having a first voltage level to said phase changing circuit when both said up signal and said guard timing signal have a first voltage level, and a second logic circuit which outputs said down signal having a first voltage level to said phase changing circuit when both said down signal and said guard timing signal have a first voltage level.

8. The phase control circuit according to claim 7, wherein said phase changing circuit selects a large frequency dividing ratio large when said up signal has a first voltage level, said phase changing circuit selects a small frequency dividing ratio when said down signal has a first voltage level.

9. A phase control circuit comprising:
a phase comparing circuit which compares respective phases of a synchronizing signal and an internal signal, and which outputs a phase control signal indicative of a comparison result, and which further outputs a lock detection signal when a phase difference between the respective phases of the synchronizing signal and the internal signal is smaller than a predetermined value;
a phase changing circuit which changes the phase of said internal signal according to said phase control signal, and which outputs the internal signal having the changed phase to a radio unit for synchronizing the radio unit;
a control circuit which is responsive to an operational mode of the radio unit, and which outputs an enable signal when said lock detection signal and an inverted guard timing signal received from the radio unit have a first voltage level, wherein the guard timing signal indicates a guard timing term during a transmitting mode or a receiving mode of the radio unit; and
a mask circuit which selectively supplies said phase control signal to said phase changing circuit according to a voltage level of said enable signal.

10. The phase control circuit according to claim 9, wherein said phase comparator outputs said phase control signal as an up signal when the phase of said internal signal is delayed relative the phase of said synchronizing signal, and as a down signal when the phase of said internal signal precedes the phase of said synchronizing signal.

11. The phase control circuit according to claim 10, wherein said mask circuit comprises a first logic circuit which outputs said up signal having a first voltage level to said phase changing circuit when said up signal and said enable signal have a first voltage level, and a second logic circuit which outputs said down signal having a first voltage level to said phase changing circuit when said down signal and said enable signal have a first voltage level.

12. The phase control circuit according to claim 11, wherein said phase changing circuit selects a large frequency dividing ratio large when said up signal has a first voltage level, said phase changing circuit selects a small frequency dividing ratio when said down signal has a first voltage level.

13. A phase control circuit comprising:
a phase comparing circuit which compares respective phases of a synchronizing signal and an internal signal, and which outputs a phase control signal indicative of a comparison result, and which further outputs a first lock detection signal when a phase difference between the respective phases of the synchronizing signal and the internal signal is smaller than a predetermined value, and a second lock detection signal when said phase difference is larger than a second predetermined value which is smaller than said first predetermined value;
a phase changing circuit which changes the phase of said internal signal according to said phase control signal, and which outputs the internal signal having the changed phase to a radio unit for synchronizing the radio unit;
a control circuit which is responsive to an operational mode of the radio unit, and which outputs an enable signal when said first and second lock detection signals and an inverted guard timing signal received from the radio unit are input, wherein the guard timing signal indicates a guard timing term during a transmitting mode or a receiving mode; and
a mask circuit which selectively supplies said phase control signal to said phase changing circuit when said enable signal is input.

14. The phase control circuit according to claim 13, wherein said phase comparator outputs said phase control signal as an up signal when the phase of said internal signal is delayed relative the phase of said synchronizing signal, and as a down signal when the phase of said internal signal precedes the phase of said synchronizing signal.

15. The phase control circuit according to claim 14, wherein said mask circuit comprises a first logic circuit which outputs said up signal to said phase changing circuit when both said up signal and said enable signal are input, and a second logic circuit which outputs said down signal to said phase changing circuit when both said down signal and said enable signal are input.

16. The phase control circuit according to claim 15, wherein said phase changing circuit selects a large frequency dividing ratio large when said up signal has a first voltage level, said phase changing circuit selects a small frequency dividing ratio when said down signal has a first voltage level.

* * * * *